(12) United States Patent
Chino

(10) Patent No.: US 6,810,059 B2
(45) Date of Patent: Oct. 26, 2004

(54) SEMICONDUCTOR LASER AND METHOD OF MANUFACTURING THE SAME

(75) Inventor: Toyoji Chino, Minoh (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/145,647

(22) Filed: May 14, 2002

(65) Prior Publication Data

US 2002/0172249 A1 Nov. 21, 2002

(30) Foreign Application Priority Data

May 17, 2001 (JP) ........................................ 2001-148230

(51) Int. Cl.[7] ................................................. H01S 5/00
(52) U.S. Cl. ............................. 372/50; 438/16; 438/40; 438/745; 257/E21.221
(58) Field of Search .............................. 372/50; 438/16, 438/40, 745; 257/E21.221

(56) References Cited

U.S. PATENT DOCUMENTS 4,652,333 A * 3/1987 Carney ........................ 438/16
6,104,738 A * 8/2000 Kitoh et al. .................. 372/46

FOREIGN PATENT DOCUMENTS

JP 6-120615 4/1994

OTHER PUBLICATIONS

Itoh, Masayuki et al., "High–Quality 1.3–$\mu$m GaInAsP–BH–Lasres Fabricated by MOVPE and Dry–Etching Technique", IEEE Photonics Technology Letters, vol. 8, Aug. 1996, pp. 989–991.

* cited by examiner

Primary Examiner—Minsun Oh Harvey
Assistant Examiner—Cornelius H. Jackson
(74) Attorney, Agent, or Firm—Merchant & Gould P.C.

(57) ABSTRACT

A semiconductor laser includes an active layer stripe including a first semiconductor layer, an active layer, and a second semiconductor layer that are laminated in that order on a substrate and formed into a stripe-shape; a burying layer in which the active layer stripe is buried; and a contact layer formed on the burying layer. The semiconductor laser further includes a monitor stripe that is formed in parallel to the active layer stripe and is composed of the first semiconductor layer only at an output end of the laser, the monitor stripe is buried in the burying layer on which the contact layer is formed, and the active layer stripe and the monitor stripe are isolated electrically by an isolation groove. The width of the active layer stripe can be controlled easily based on the width of the active layer in the monitor stripe as a criterion.

5 Claims, 6 Drawing Sheets

SEMICONDUCTOR LASER AND METHOD OF MANUFACTURING THE SAME

BACKGROUND OF THE INVENTION

1. Field of the Invention

The present invention relates to a semiconductor laser and a method of manufacturing the same.

2. Related Background Art

Among conventional methods for manufacturing semiconductor lasers, the present invention relates to methods for manufacturing semiconductor lasers made on an In-P substrate and used for optical communication, more specifically, narrow radiation angle lasers that emit a laser beam with a narrow radiation angle. The narrow radiation angle laser is classified into a type having an active layer and a waveguide layer, which make up the laser, with film thicknesses varying along the cavity direction for narrowing a radiation angle, and a type having a taper shaped active layer stripe with the width varying in the cavity direction to have a taper shape for narrowing a radiation angle, without varying the film thicknesses of an active layer and a waveguide layer. In the latter type, the taper shaped active layer stripe is formed by etching laminated films including the active layer formed on a substrate through a taper shaped dielectric mask provided on the laminated films.

The following describes a method of manufacturing the above-mentioned narrow radiation angle laser of the taper shaped active layer type, with reference to FIG. 6. FIG. 6 is a front view of the semiconductor laser at the output end side of the semiconductor laser. Firstly, as shown in FIG. 6A, a n-InP layer 601, an active layer 602, and a p-InP layer 603 are formed on a n-InP substrate 600 in this order. On these layers, a $SiO_2$ film 604 is deposited, as shown in FIG. 6B. Next, the $SiO_2$ film 604 is patterned in a stripe shape by ordinary photolithography and reactive ion etching methods, resulting in a $SiO_2$ mask 605 as shown in FIG. 6C. The $SiO_2$ mask 605 is formed into a taper shape, so that the width of the mask is made narrower gradually, like a sector, from the rear end of the semiconductor laser toward the output end. The difference between the widths of the rear end and the output end of the $SiO_2$ mask 605 approximately is 1 $\mu$m. The cavity length is in a range between approximately 300 $\mu$m and 800 $\mu$m.

Next, the n-InP layer 601, the active layer 602, and the p-InP layer 603 are removed by a mixed solution including acetic acid, hydrochloric acid, and a hydrogen peroxide solution using the $SiO_2$ mask 605 (See FIG. 6D). In this process, these layers are side-etched from the side edge portions of the $SiO_2$ mask 605, so that the width of the active layer 602 becomes smaller than that of the $SiO_2$ mask 605. This etching process is completed when the width of the active layer 602 becomes a predetermined value. A target value of the width of the active layer 602 is in a range between 0.5 $\mu$m and 1.0 $\mu$m. After that, in order to make the height of the upper surface of the n-InP layer 601, which is exposed as a result of the etching process, from the surface of the n-InP substrate 600 a predetermined value, etching is conducted by a mixture solution including hydrochloric acid and phosphoric acid so as not to change the width of the active layer 602. As a result of these wet-etching processes, a taper shaped active layer stripe is formed.

Next, as shown in FIG. 6E, a p-InP burying layer 606, a n-InP burying layer 607, a p-InP burying layer 608, and a contact layer 609 are grown in this order by the vapor growth method. Finally, as shown in FIG. 6F, isolation grooves 610 and 611 and a p-type electrode 612 are formed on the surface and a n-type electrode 613 is formed on the rear surface so as to complete the laser.

However, the above conventional manufacturing method has the following problems.

In the wet-etching process for forming a taper shaped active layer stripe, where the width of the active layer 602 is patterned into a sub-micron size by carrying out side-etching from the side edges of the $SiO_2$ mask 605, the end point where the etching is to be finished (hereafter simply called "etching end point") is detected by measuring the width of the active layer 602 with an optical microscope so as to confirm that the width is within a predetermined dimension. In this case, it is difficult to measure the width of the active layer 602 with the optical microscope accurately. In addition, although the width of the taper shaped active layer stripe varies in the cavity direction, this stripe might be recognized as a stripe having a uniform width on the wafer, because the difference between the widths of the rear end and the output end thereof approximately is only 1 $\mu$m. Therefore, it is considerably difficult to identify the output end portion of the stripe by a visual inspection.

Due to this difficulty, it might take considerable time to identify the output end portion, which deteriorates a production efficiency, or an error in identifying the output end position might occur. Furthermore, due to the difficulty in measuring the width of the active layer of a sub-micron size, improper measurement often occurs, which causes poor qualities of patterning and laser characteristics.

SUMMARY OF THE INVENTION

Therefore, with the foregoing in mind, it is an object of the present invention to provide a semiconductor laser and a method of manufacturing the same, by which the etching end point can be detected easily and thus improper measurement can be prevented when patterning the width of an active layer stripe at the output end into a sub-micron size.

The semiconductor laser according to present invention has a basic construction composed of an active layer stripe including a first semiconductor layer, an active layer, and a second semiconductor layer that are laminated in that order on a substrate and are formed into a stripe-shape; a burying layer in which the active layer stripe is buried; and a contact layer formed on the burying layer.

To cope with the above-stated problems, the semiconductor laser having the basic construction of the present invention further includes a monitor stripe that is formed in parallel to the active layer stripe and is composed of the first semiconductor layer only at an output end of the laser, the monitor stripe is buried in the burying layer on which the contact layer is formed, and the active layer stripe and the monitor stripe are isolated electrically by an isolation groove.

With this construction, the etching end point can be detected easily by using a timing when the active layer in the monitor stripe at the output end disappears as a criterion. As a result, the width of the active layer stripe can be formed with high accuracy.

In the basic construction, it is preferable that the monitor stripe changes in width in a cavity direction so as to have a narrow width region at the output end and a wide width region provided at least at one portion of the stripe other than at the output end, and the wide width region of the monitor stripe is composed of the first semiconductor layer and the second semiconductor layer. With this construction, it becomes easy to identify the output end in the monitor stripe.

In the above construction, preferably, the first semiconductor layer of the monitor stripe in the narrow width region is thicker at a center portion in a width direction than the other portions.

In addition, in the above basic construction, it is preferable that the monitor stripe is composed of the first semiconductor layer, and the first semiconductor layer in the monitor stripe is thicker at a center portion in a width direction than the other portions.

The method of manufacturing a semiconductor laser according to the present invention includes: forming a lamination film for stripe by depositing a first semiconductor layer, an active layer including a semiconductor multilayer, and a second semiconductor layer in this order on a substrate; forming a mask by depositing a dielectric film on the lamination film for stripe and shaping the dielectric film into a predetermined shape so as to form a first dielectric mask; and etching the lamination film for stripe through the first dielectric mask so as to form an active layer stripe. In the step of forming the mask, a second dielectric mask also is formed in parallel to the first dielectric mask. In the step of etching the lamination film, the active layer stripe is formed through the first dielectric mask so as to be located just below the first dielectric mask and at the same time a monitor stripe is formed through the second dielectric mask so as to be located just below the second dielectric mask, and completion of the etching is detected according to a width of an active layer in the monitor stripe at an output end of the laser as a criterion.

With this method, the etching end point is detected according to the width of the active layer in the monitor stripe, and therefore an optimum condition for detecting the etching end point can be set for any construction of the active layer stripe.

In the above method, a width of the first dielectric mask and a width of the second dielectric mask may be set to be equal.

In addition, the second dielectric mask may be formed so as to vary in width in a cavity direction and have a narrow width region at the output end and a wide width region provided at least at one portion of the mask other than at the output end. With this method, it becomes easy to observe the width of the active layer in the monitor stripe at the output end.

In the above-stated method, preferably, assuming that at the output end of the laser subjected to the etching process a width of the active layer in the active layer stripe is Wa, a width of the first dielectric mask is W1, and a width of the second dielectric mask is W2, values of W1, W2, and Wa respectively are set so as to satisfy a relationship represented by the following Formula 1:

$$W2 \leq W1-Wa \tag{1}$$

With this method, the output end width of the active layer stripe located adjacent to the monitor stripe becomes the optimum value at the timing when the active layer just below the monitor stripe disappears.

Alternatively, the values of W1, W2, and Wa respectively are set so as to satisfy a relationship represented by the following Formula 2:

$$W1-Wa-\alpha \leq W2 \leq W1-Wa+\alpha \tag{2}$$

where α denotes a value set according to a tolerance of Wa.

With this method, variations in the width of the active layer stripe further can be made smaller.

In the above-stated method, preferably, assuming that a width of the first dielectric mask at the output end is W1 and a width of the second dielectric mask in the wide width region is W2r, values of W1 and W2r respectively are set so as to satisfy a relationship represented by the following Formula 3:

$$W1 \leq W2r \tag{3}$$

Even in this case, since the width of the second dielectric mask at the output end is narrow, it is easy to make visual inspection of disappearance of the active layer in the monitor stripe at the output end. Moreover, since the width of the second dielectric mask is wide enough at portions other than the output end, the second dielectric mask can be prevented from delaminating.

Furthermore, subsequent to the above-stated steps, the following steps further may be conducted: that is, forming a burying layer so as to bury the active layer stripe formed in the etching step; forming a contact layer on the burying layer; and forming an isolation groove at a position where the monitor stripe was formed so as to remove the monitor stripe.

DETAILED DESCRIPTION OF THE INVENTION

The following describes embodiments of the present invention, with reference to FIGS. 1 through 5.

[Embodiment 1]

Figure 1:
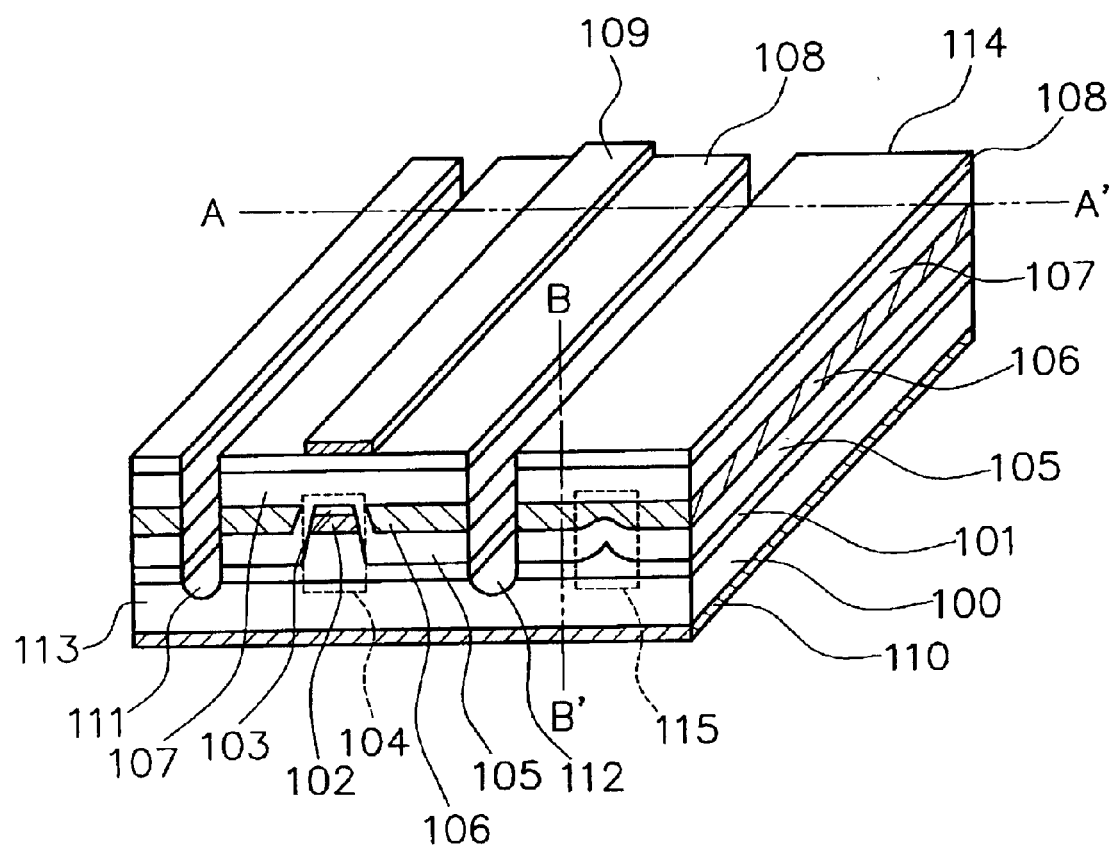
FIG. 1 is a perspective view of a semiconductor laser according to Embodiment 1 of the present invention.

FIG. 1 is a perspective view of a semiconductor laser according to Embodiment 1 of the present invention. In FIG. 1, on a n-InP substrate 100, a n-InP layer 101, an active layer 102 including a semiconductor multilayer, and a p-InP layer 103 are laminated in this order. These layers are patterned into a stripe shape so as to make up an active layer stripe 104. The active layer stripe 104 is buried in a p-InP burying layer 105, a n-InP burying layer 106, a p-InP burying layer 107, and a contact layer 108. On the contact layer 108, a p-type electrode 109 is formed, whereas on the rear surface of the n-InP substrate 100, a n-type electrode 110 is formed. On either side of the active layer stripe 104, in order to decrease an electric capacity of the semiconductor laser and provide electrical isolation from a monitor stripe 115, which will be described later, isolation grooves 111 and 112 are formed so as to reach the n-InP substrate 100.

An end-face 113 shown in FIG. 1 is at an output end of a laser beam, whereas the opposite surface is a rear end 114. A width (Wa) of the active layer 102 at the output end 113 approximately is 0.7 μm, which is narrower than a width of the active layer 102 at the rear end (approximately 1.7 μm).

The monitor stripe 115 is formed adjacent to the active layer stripe 104. The monitor stripe 115 is used during the manufacturing process of the semiconductor laser according to Embodiment 1, and does not have electrical and optical functions as a semiconductor laser. Therefore, during the process for manufacturing the semiconductor laser, the laser may be cut along the line B–B' shown in FIG. 1 so as not to leave the monitor stripe 115 in the finished semiconductor laser.

Figure 2:
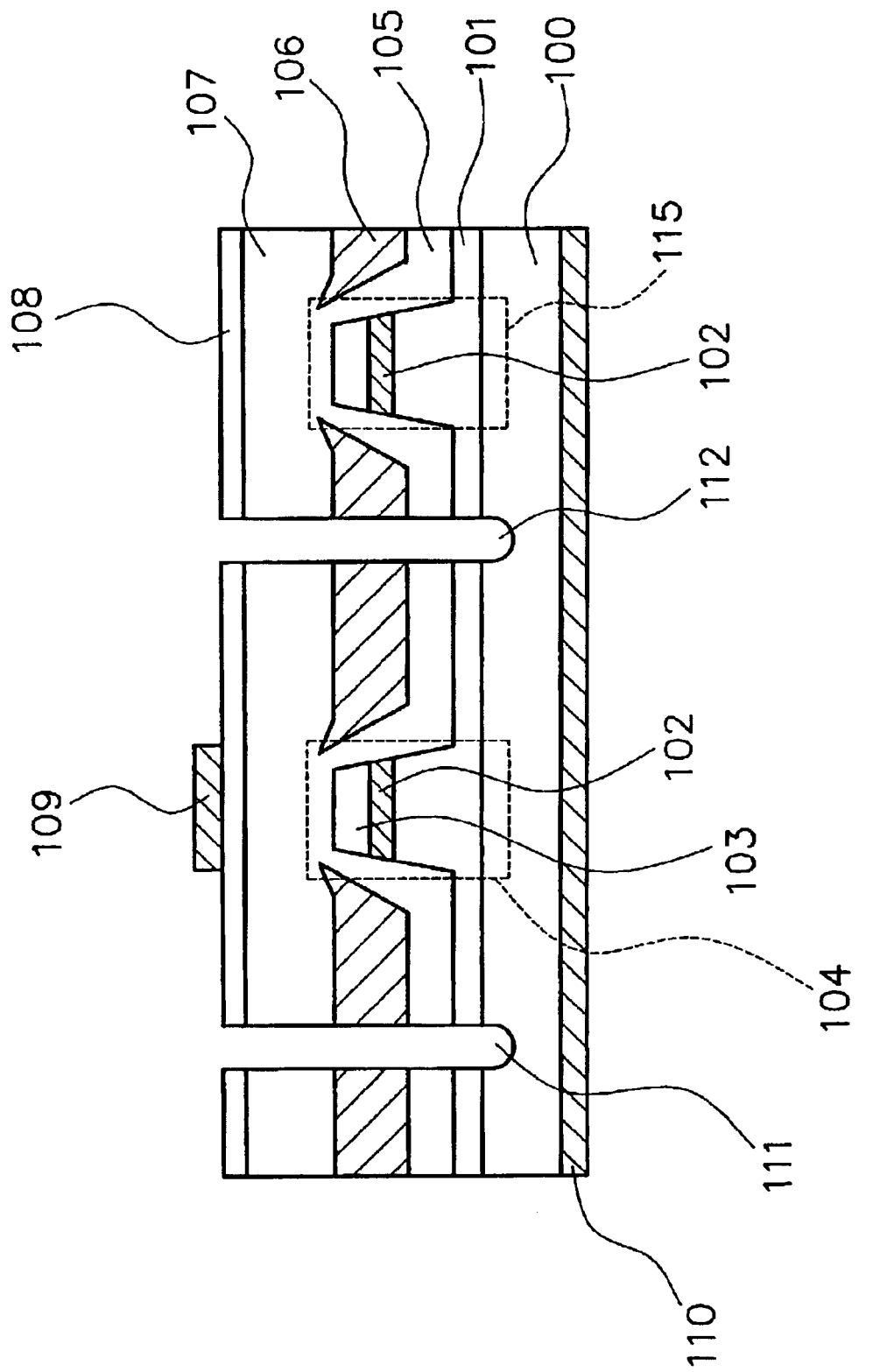
FIG. 2 is a cross-sectional view taken along the line A–A' in FIG. 1.

FIG. 2 is a cross-sectional view taken along the line A–A' in FIG. 1. The n-InP layer 101, the active layer 102, and the p-InP layer 103 are patterned into a stripe shape so as to make up the active layer stripe 104. The monitor stripe 115 also is formed adjacent to the active layer stripe 104. The monitor stripe 115 also has the n-InP layer 101, the active layer 102, and the p-InP layer 103 which are patterned into a stripe shape. The cross-section of the monitor stripe 115 in FIG. 2 differs from the cross-section thereof at the output end 113 shown in FIG. 1 as to whether the active layer 102 is left. That is, a dielectric mask (not illustrated) used for forming the monitor stripe 115 in an etching process has two regions different in width in the cavity direction, where the width is narrow in the vicinity of the output end, while wide in the vicinity of the rear end. Thereby, the active layer 102 disappears at a portion in the vicinity of the output end during a stripe forming process by etching, so that the monitor stripe 115 has such differently constructed portions along the cavity direction.

With the above-described construction, the etching end point can be detected easily by observing the width of the active layer 102 at the output end in the monitor stripe 115 during the etching process, for example, by using a timing when the active layer 102 at the output end disappears as a criterion. As a result, the width of the active layer stripe 104 in the semiconductor laser having the structure shown in FIG. 1 can be formed with high accuracy.

When the etching end point is detected by referring to the timing of disappearance of the active layer 102, the center portion of the n-InP layer 101 in the width direction in the monitor stripe 115 becomes thicker than the other portions so that a protrusion is formed at the portion, as shown in FIG. 1.

Although in this embodiment, the monitor stripe has a structure with a wide width region and a narrow width region, the monitor stripe may be uniform in width so that the active layer 102 is left along all of the cavity length. Alternatively, cross-sections of the monitor stripe along all of the cavity length may have a structure as shown by the output end 113 in FIG. 1, where there is no active layer 102 left.

In addition, in the construction of FIG. 1, an antireflection coating and a reflection coating may be deposited on the output end and the rear end, respectively. Otherwise, both ends may be cleavage planes, or only the rear end-face may be provided with a reflection coating.

[Embodiment 2]

FIGS. 3A to 3F and FIGS. 4A to 4F are cross-sectional views of a semiconductor laser for explaining a manufacturing process of the same according to Embodiment 2. FIGS. 3A to 3F are cross-sections at an output end of the semiconductor laser, while FIGS. 4A to 4F are cross-sections in the vicinity of a rear end of the semiconductor laser.

Figure 3A:
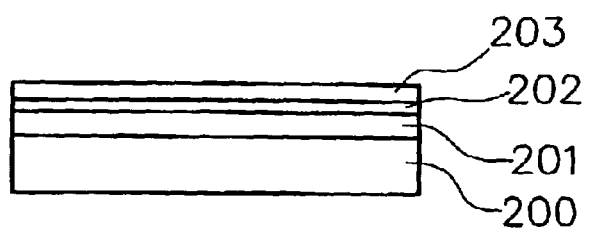
FIGS. 3A to 3F are cross-sectional views of a semiconductor laser for explaining a manufacturing process of the same according to Embodiment 2.
Figure 3B:
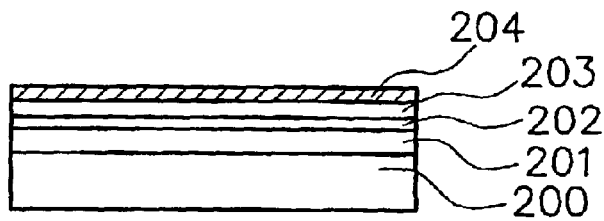
Figure 3C:
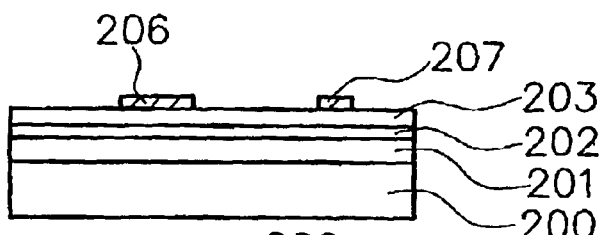

Firstly, as shown in FIG. 3A, a n-InP layer 201, an active layer 202, and a p-InP layer 203 are formed on a n-InP substrate 200 in this order by the crystal growth method. On these layers, as shown in FIG. 3B, an SiO$_2$ film 204 is deposited by the use of the plasma CVD method. Then, as shown in FIG. 3C, the SiO$_2$ film 204 is patterned into a stripe shape by the use of a photolithographic technique. As a result of this process, a first SiO$_2$ mask 206 for forming an active layer stripe 205 (See FIG. 3D) and a second SiO$_2$ mask 207 for forming a monitor stripe 216 (See FIG. 3D) are formed parallel to each other.

Figure 5:
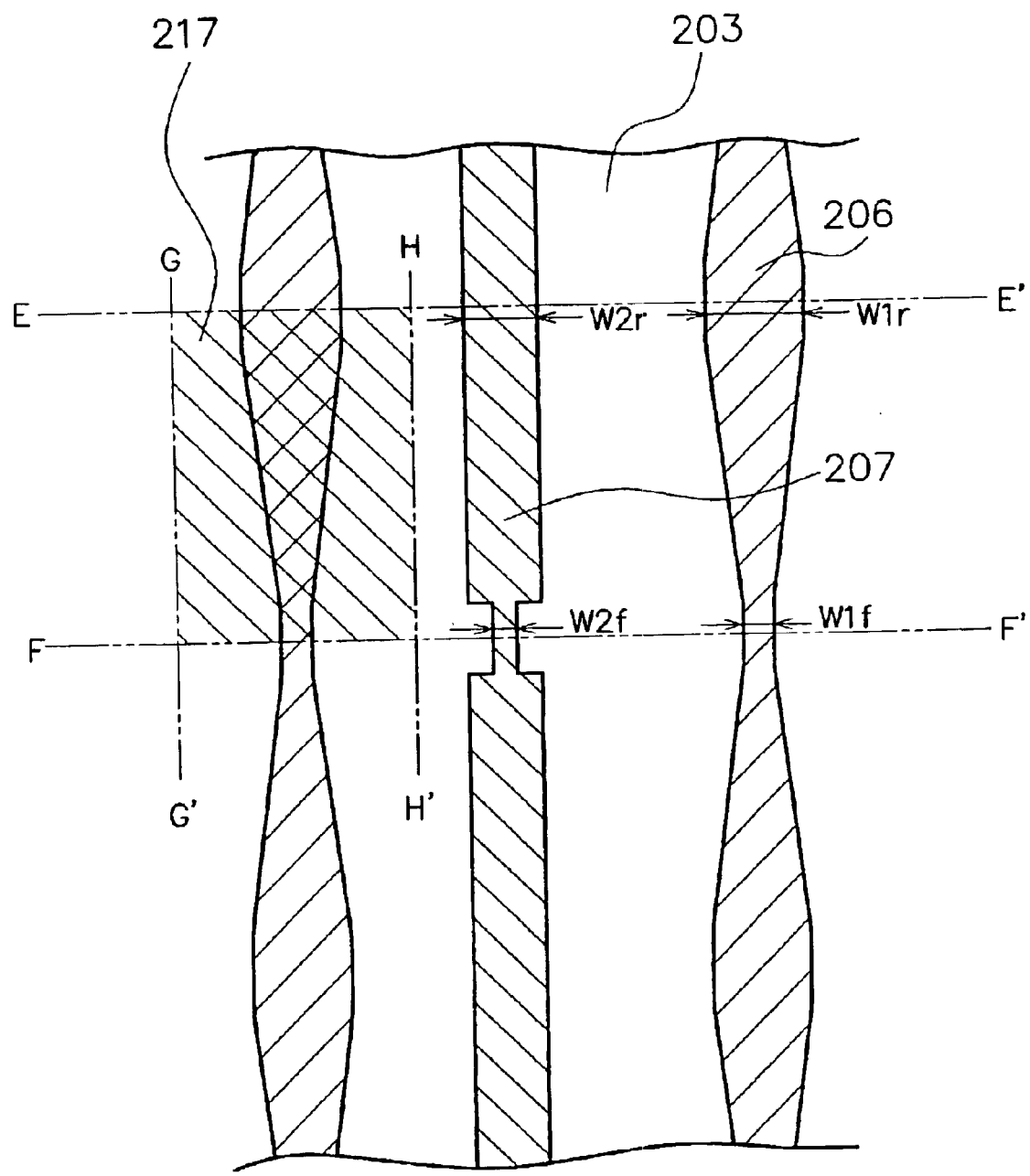
FIG. 5 is a plan view of the wafer in a step of the manufacturing processes shown in FIGS. 3A to 3F and FIGS. 4A to 4F.
Figure 6A:
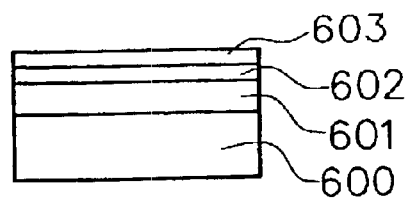
FIGS. 6A to 6F are front views for showing a conventional method of manufacturing a semiconductor laser.
Figure 6B:
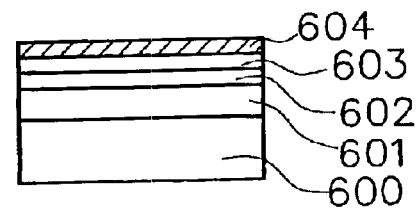
Figure 6C:
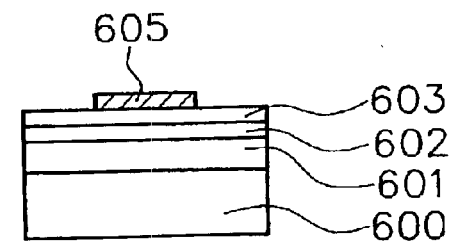
Figure 6D:
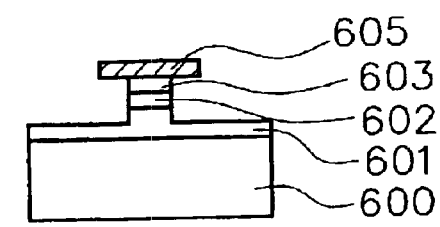
Figure 6E:
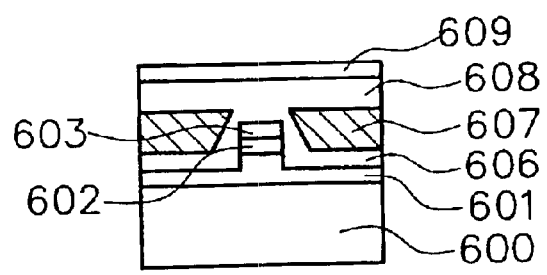
Figure 6F:
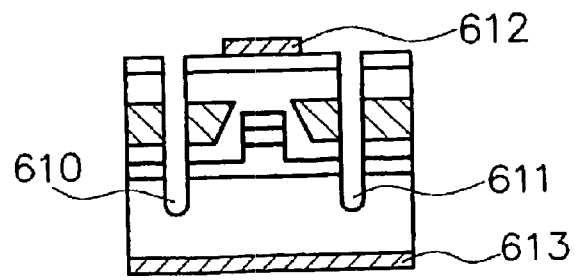

As shown in FIG. 5, the first SiO$_2$ mask 206 has a taper shape along the cavity direction of the semiconductor laser, where the width of the mask becomes narrower gradually toward the output end from the rear end, and the difference between the widths of the rear end and the output end is approximately 1 μm. FIG. 5 is a plan view of a wafer used in the steps shown by FIG. 3C and FIG. 4C. This figure shows a state where the first SiO$_2$ mask 206 for forming the active layer stripe and the second SiO$_2$ mask 207 for forming the monitor stripe are patterned on the p-InP layer 203. A region surrounded by lines E–E', F–F', G–G', and H–H' in FIG. 5 corresponds to a semiconductor laser chip 217, and the line F–F' indicates a position of the output end. Meanwhile, the second SiO$_2$ mask 207 is narrow in the vicinity of the output end and wider at a portion a small distance away from there. This configuration of providing the wider portion is for preventing the second SiO$_2$ mask 207 from delaminating in the wet-etching process as described later.

Figure 3D:
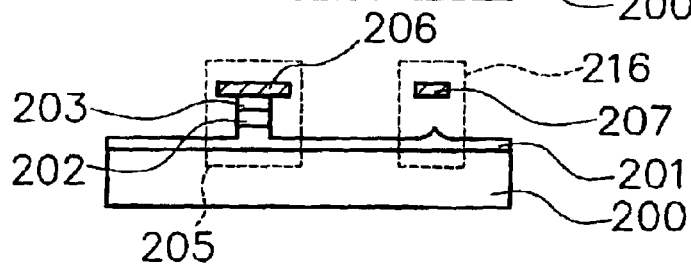

Next, as shown in FIG. 3D, the n-InP layer 201, the active layer 202, and the p-InP layer 203 are wet-etched using a mixed solution including hydrochloric acid, acetic acid, and a hydrogen peroxide solution, through the first SiO$_2$ mask 206 and the second SiO$_2$ mask 207. In this wet-etching process, a portion of the n-InP substrate 200 might be etched due to variations in the wet-etching conditions. Assuming that the widths of the first SiO$_2$ mask 206 and the second SiO$_2$ mask 207 at the output end are W1 and W2, respectively, and the output end width of the active layer stripe 205 formed below the first SiO$_2$ mask 206 is Wa, a relationship among these values is set so as to satisfy the following Formula 1. Thereby, the etching process can be finished so that, when the active layer just below the second SiO$_2$ mask 207 in the vicinity of the output end disappears by side-etching, the width of the adjacent active layer stripe 205 at the output end approximately becomes equal to Wa as a target value.

$$W2 \leq W1 - Wa \qquad (1)$$

In other words, the width of the active layer stripe 205 at the output end becomes the optimum value at the timing when the active layer 102 just below the second SiO$_2$ mask 207 disappears, whereby the etching end point can be detected. With this end point detection method, variations in the width of the active layer stripe 205 can be suppressed, and thus the characteristics of the semiconductor laser can be stabilized.

Alternatively, the above W1, W2, and Wa may be set so as to satisfy the following Formula 2. Thereby, variations in the width of the active layer stripe 205 further can be made smaller. In this formula, α denotes a value set according to a tolerance of Wa, and may be set to the value ranging from 0.1 μm to 0.2 μm.

$$W1 - Wa - \alpha \leq W2 \leq W1 - Wa + \alpha \qquad (2)$$

As in this embodiment, by making the width of the second SiO$_2$ mask 207 for forming the monitor stripe 216 narrower only in the vicinity of the output end but wider at other portions, it becomes quite easy to observe the output end of the monitor stripe 216 visually, resulting in the improvement of the production efficiency. Further, even in the case where a borderline of the side edges of the active layer stripe 205 is blurred when measuring the width of the active layer stripe 205 through the first SiO₂ mask 206 with an optical microscope, it can be confirmed that the width of the active layer stripe 205 becomes the optimum value according to the timing when the active layer 202 in the monitor stripe 216 at the output end just disappears.

Figure 3E:
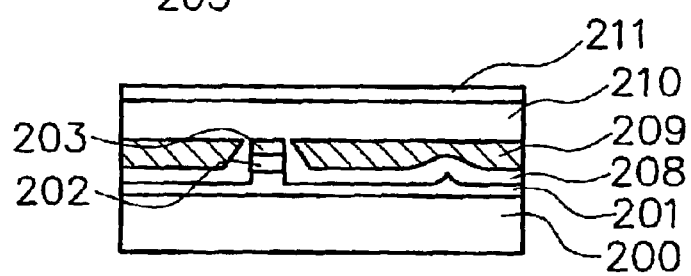

Next, as shown in FIG. 3E, after removing the first and second SiO₂ masks 206 and 207 using a buffered hydrofluoric acid, a p-InP burying layer 208, a n-InP burying layer 209, a p-InP layer 210, and a contact layer 211 are grown in this order so as to bury the active layer stripe 205 and the monitor stripe 216.

Figure 3F:
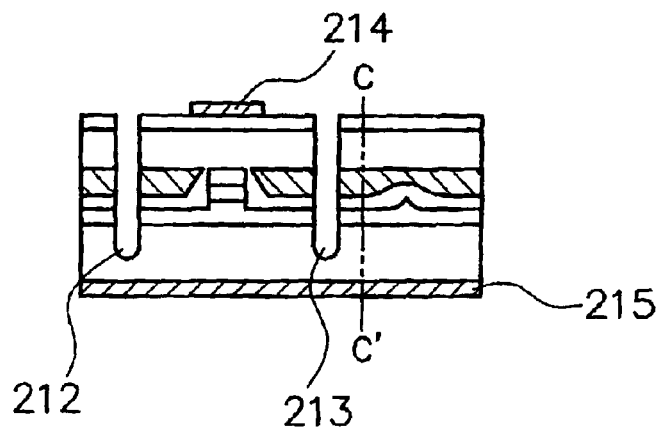
Figure 4A:
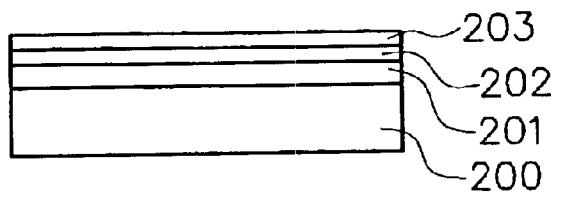
FIGS. 4A to 4F are cross-sectional views of another portion of the wafer used in the same manufacturing process as in FIGS. 3A to 3F.
Figure 4B:
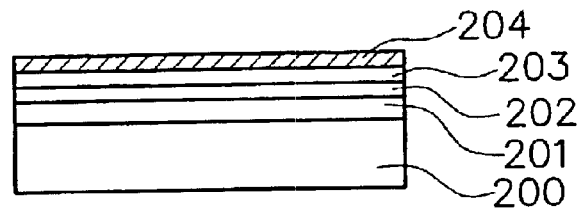
Figure 4C:
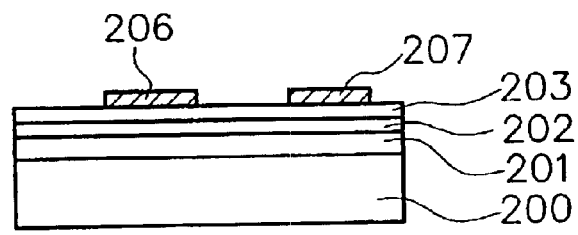
Figure 4D:
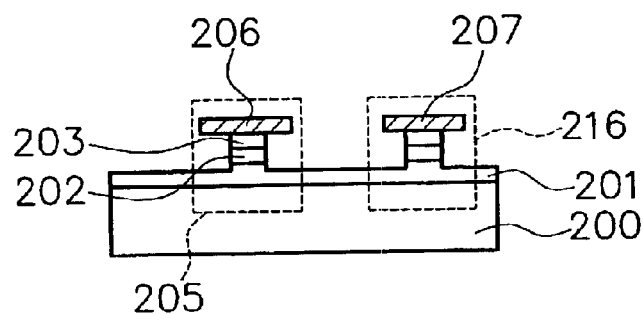
Figure 4E:
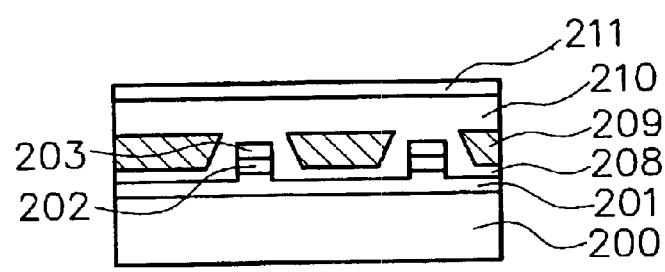
Figure 4F:
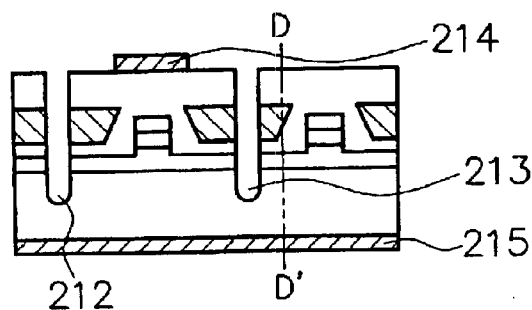

Next, as shown in FIG. 3F, isolation grooves 212 and 213 for decreasing an electric capacity of the semiconductor laser and providing electrical isolation between the active layer stripe 205 and the monitor stripe 216 are formed. After that, a p-type electrode 214 and a n-type electrode 215 are formed by evaporation on the top surface and the back of the n-InP substrate 200, respectively.

When cutting the semiconductor laser manufactured according to the method in this embodiment into a chip from the wafer, the monitor stripe 215 does not necessarily remain in the chip, but the laser may be cut along the line C–C' as shown in FIG. 3F.

FIGS. 4A to 4F show a state of the semiconductor laser in the vicinity of the rear end in the same manufacturing process as in the above FIGS. 3A to 3F. Since the steps correspond to each other and the same reference numerals are assigned to each element, explanations will not be repeated. As is evident from a comparison between FIG. 4D and FIG. 3D, a difference in FIGS. 4A to 4F from FIGS. 3A to 3F resides in the active layer 202 remaining just below the monitor stripe 216. This is because, as shown in FIG. 5, the width of the second SiO₂ mask 207 is set wider enough in the vicinity of the rear end than in the vicinity of the output end.

After giving some required surface treatments to the wafer subjected to the above-stated steps, the wafer is cleaved along the lines E–E', F–F', G–G', and H–H' indicated in FIG. 5, so that the semiconductor laser chip 217 is obtained.

The following describes one example of the width of each mask shown in FIG. 5. W1f and W1r denote the widths of the first SiO₂ mask 206 at the output end and the rear end, respectively, and W2f and W2r denote the widths of the second SiO₂ mask 207 at the output end and the rear end, respectively. Waf and War, which are widths of the active layer in the active layer stripe formed by using the first SiO₂ mask 206 at the output end and the rear end, respectively, also are described.

W1f: 3.6 μm, W2f: 3.6 μm, Waf: 0.7 μm

W1r: 4.6 μm, W2r: 4.6 μm, War: 1.7 μm

Note here that the SiO₂ mask for forming the monitor stripe may have a uniform width and have a rectangular shape. In addition, in the vicinity of the output end, the width of the first SiO₂ mask for forming the active layer stripe may be made narrower than the width of the second SiO₂ mask for forming the monitor stripe. In this case, however, the width of the second SiO₂ mask for forming the monitor stripe should be made narrower in the vicinity of the output end only, so that the above-stated condition can be satisfied. That is to say, assuming that the width of the first SiO₂ mask at the output end is W1 and the width of the second SiO₂ mask at a wider width region is W2r, then values of W1 and W2r may be set so as to satisfy the following Formula 3.

$$W1 \leq W2r \tag{3}$$

Thereby, it becomes easy to make visual observation of the active layer in the monitor stripe at the output end.

In the above-mentioned embodiments, the isolation groove is formed between the monitor stripe and the active layer stripe. However, the position of the isolation groove may coincide with the monitor stripe, whereby the monitor stripe does not remain in the finished semiconductor laser. This is because the monitor stripe is formed only for the purpose of controlling the width of the active layer when forming the active layer stripe.

The above-stated embodiments deal with a case of a semiconductor laser whose width of the active layer stripe changes like a taper, which is to say, a taper shaped active layer type narrow radiation angle laser. Although it is difficult to identify the positions of the rear end and the output end of the taper shaped active layer on the wafer by visual observation, the monitor stripe according to the present invention enables easy control of the width of the taper shaped active layer. As a result, the processing time required for forming the active layer stripe can be decreased significantly.

The present invention may be applied to a semiconductor laser with an active layer stripe not in a taper shape, with similar significant practical effects. This is because it is difficult to control the etching process by directly observing the width of the active layer stripe even in the case of the active layer stripe not in a taper shape.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing a semiconductor laser, comprising:

(a) forming a lamination film for a stripe by depositing a first semiconductor layer, an active layer including a semiconductor multilayer, and a second semiconductor layer in this order on a substrate, (b) forming a mask by depositing a dielectric film on the lamination film for a stripe and shaping the dielectric film into a predetermined shape so as to form a first dielectric mask, (c) etching the lamination film for a stripe through the first dielectric mask so as to form an active layer stripe, (d) removing the mask, (e) forming a burying layer, and (f) forming a contact layer on the burying layer, wherein in the step of forming the mask, a second dielectric mask also is formed on the lamination film in parallel to the first dielectric mask the second dielectric mask having width varying in a cavity direction and having a narrow width region at the output end and a wide width region provided at least at one portion of the mask other than at the output end, in the step of etching the lamination film for a stripe, the active layer stripe is formed through the first dielectric mask so as to be located just below the first dielectric mask, and at the same time a monitor stripe is formed through the second dielectric mask so as to be located just below the second dielectric mask, and completion of the etching is detected according to disappearance of the active layer in the monitor stripe at an output end of the laser as a criterion, and after the step of forming the contact layer, the active layer stripe is isolated electrically from the monitor stripe by an isolation groove.

2. The method of manufacturing the semiconductor laser according to claim 1, wherein assuming that at the output end of the laser subjected to the etching process a width of the active layer in the active layer stripe is Wa, a width of the first dielectric mask is W1, and a width of the second dielectric mask is W2, values of W1, W2, and Wa respectively are set so as to satisfy a relationship represented by the following Formula 1:

$$W2 \leq W1 - Wa \tag{1}$$

3. The method of manufacturing the semiconductor laser according to claim 1, wherein assuming that at the output end of the laser subjected to the etching process a width of the active layer in the active layer stripe is Wa, a width of the first dielectric mask is W1, and a width of the second dielectric mask is W2, values of W1, W2, and Wa respectively are set so as to satisfy a relationship represented by the following Formula 2:

$$W1 - Wa - \alpha \leq W2 W1 - Wa + \alpha \tag{2}$$

where $\alpha$ denotes a value set according to a tolerance of Wa.

4. The method of manufacturing the semiconductor layer according to claim 1, wherein assuming that a width of the first dielectric mask at the output end is W1 and a width of the second dielectric mask in the wide width region is W2r, values of W1 and W2r respectively are set so as to satisfy a relationship represented by the following Formula 3:

$$W1 \leq W2r \tag{3}$$

5. The method of manufacturing the semiconductor laser according to claim 1, further comprising the steps of:

forming a burying layer so as to bury the active layer stripe formed in the etching step;

forming a contact layer on the burying layer; and forming an isolation groove at a position where the monitor stripe was formed so as to remove the monitor stripe.

* * * * *